United States Patent
Gilleo

(10) Patent No.: US 6,936,644 B2
(45) Date of Patent: Aug. 30, 2005

(54) RELEASABLE MICROCAPSULE AND ADHESIVE CURING SYSTEM USING THE SAME

(75) Inventor: Kenneth B. Gilleo, Cranston, RI (US)

(73) Assignee: Cookson Electronics, Inc., Foxborough, MA (US)

( * ) Notice: Subject to any disclaimer, the term of this patent is extended or adjusted under 35 U.S.C. 154(b) by 270 days.

(21) Appl. No.: 10/271,511

(22) Filed: Oct. 16, 2002

(65) Prior Publication Data

US 2004/0074089 A1 Apr. 22, 2004

(51) Int. Cl.$^7$ ............... C08K 3/04; C08K 9/10; C08K 63/00; C08K 63/02
(52) U.S. Cl. ............ 523/205; 523/400; 523/468; 524/558; 524/560; 524/563; 524/565; 524/566; 524/570; 524/575; 524/590; 524/601; 524/606
(58) Field of Search .................. 523/205, 400, 523/468; 525/533; 524/558, 560, 563, 565, 566, 570, 575, 590, 601, 606

(56) References Cited

U.S. PATENT DOCUMENTS

| | | | |
|---|---|---|---|
| 4,224,422 A | 9/1980 | Rude et al. | 525/454 |
| 4,391,663 A | 7/1983 | Hutter, III | 156/64 |
| 4,536,524 A | 8/1985 | Hart et al. | 523/176 |
| 4,581,421 A | 4/1986 | Waddill et al. | 525/504 |
| 4,581,422 A | 4/1986 | Speranza et al. | 525/504 |
| 4,581,423 A | 4/1986 | Speranza et al. | 525/504 |
| 4,833,226 A * | 5/1989 | Ishimura et al. | 528/45 |
| 5,001,542 A * | 3/1991 | Tsukagoshi et al. | 257/746 |
| 5,129,977 A | 7/1992 | Leatherman | 156/272.4 |
| 5,712,469 A | 1/1998 | Chaffin et al. | 219/765 |
| 5,800,163 A | 9/1998 | Rueggeberg et al. | 433/9 |
| 6,007,664 A | 12/1999 | Kuizenga et al. | 156/272.8 |
| 6,113,728 A | 9/2000 | Tsukagoshi et al. | 156/264 |
| 6,294,270 B1 | 9/2001 | Clough | 428/620 |
| 6,361,923 B1 | 3/2002 | Kresge et al. | 430/280.1 |
| 2002/0010272 A1 | 1/2002 | Mahdi et al. | 525/100 |

FOREIGN PATENT DOCUMENTS

| | | |
|---|---|---|
| EP | 0171919 A2 | 2/1986 |
| EP | 1229181 A1 | 2/2001 |
| EP | 1 364 979 A1 | 11/2003 |
| EP | 1411102 A1 | 4/2004 |
| JP | 02011619 A | 1/1990 |
| JP | 01112963 | 12/1990 |
| JP | 06025470 A | 2/1994 |
| JP | 05165049 | 3/1994 |
| JP | 06126153 A | 5/1994 |
| JP | 06236029 | 3/1996 |
| JP | 07237342 | 3/1997 |
| JP | 09279121 A | 10/1997 |
| JP | 2000129238 A | 5/2000 |
| JP | 2000319620 A | 11/2000 |
| WO | WO 02/09863 A2 | 2/2000 |
| WO | WO 01/46290 A1 | 6/2000 |

OTHER PUBLICATIONS

English language Abstract of Japanese Patent No. 59081373 (Application No. 57191217) obtained from http://ep.espacenet.com, May 11, 1984.

English language Abstract of Japanese Patent No. 60071628 (Application No. 58177875) obtained from http://ep.espacenet.com, Apr. 23, 1985.

English language Abstract of Japanese Patent No. 61103906 (Application No. 59226081) obtained from http://ep.espacenet.com, May 22, 1986.

English language Abstract of Japanese Patent No. 1287131 (Application No. 63067244) obtained from http://ep.espacenet.com, Nov. 17, 1989.

English language Abstract of Japanese Patent No. 2292324 (Application No. 01112962) obtained from http://ep.espacenet.com, Dec. 3, 1990.

English language Abstract of Japanese Patent No. 11001666 (Application No. 09173195) obtained from http://ep.espacenet.com, Jan. 6, 1999.

* cited by examiner

Primary Examiner—Robert Sellers
(74) Attorney, Agent, or Firm—Senniger Powers

(57) ABSTRACT

An uncured epoxy adhesive comprising a resin component, a hardener component, and a microencapsulated accelerator component. The microencapsulated accelerator component comprises an infrared absorber, an accelerator and a wall that covers substantially the entire surface of the accelerator. The epoxy adhesive is cured by exposing it to infrared energy. The infrared energy is absorbed by the infrared absorber which disintegrates the wall and allows the accelerator to come into contact with the other adhesive components and initiate the curing polymerization reaction.

42 Claims, No Drawings

RELEASABLE MICROCAPSULE AND ADHESIVE CURING SYSTEM USING THE SAME

BACKGROUND OF THE INVENTION

This invention relates to the curing of an epoxy adhesive using infrared and/or near-infrared energy (hereinafter collectively referred to as "IR energy"). In particular, the invention relates to encapsulating an epoxy adhesive component in a releasable microcapsule which disintegrates upon being exposed to IR energy thereby releasing the encapsulated epoxy adhesive component and resulting in the curing of the epoxy adhesive.

Adhesives are used widely throughout numerous industries and are especially useful in the manufacture of electronic devices. For example, adhesives are widely used for attaching semiconductor chips with projecting electrodes to wiring substrates. It is desirable to apply and activate adhesives cleanly, safely and rapidly. Nearly all electronic device adhesives utilize some form of energy to activate the adhesives (e.g., thermal or ultraviolet).

The laser is an important source of IR energy in electronics manufacturing. For example, solid-state diode lasers are widely used due to their simplicity, low cost and high efficiency to selectively heat solders. One such laser is a diode type laser, model DLS, available from Speedline Technologies/Electrovert of Camdenton, Mo. which emits at a wavelengths between about 802 to 808 nm. Lasers have also been used to bond thermoplastic adhesives together and to other materials such as glass. Thermoplastic materials, however, absorb little or no IR energy so an IR absorber (e.g., carbon and/or IR absorbing dyes) must be added to the thermoplastic adhesives.

Thermoset adhesives (e.g., epoxies) are generally considered to be superior to thermoplastic adhesives because thermoset adhesives can be applied as a liquid that is easy to print or dispense with a needle onto a substrate. Further, thermoset adhesives are more heat resistant than thermoplastic adhesives which soften and expand as temperatures increase. Presently, thermoset adhesives are usually cured by heating an assembly being joined to a temperature of at least about 150° C. for a duration of about 5 minutes to about 6 hours. Microwave energy has been used to decrease the duration of the thermal curing operation. This approach, however, has disadvantages that prevent its widespread use. For example, microwave generators present radiation hazards and special safety features must be maintained. They also cause radio interference and as a result must be licensed by governmental authorities. The equipment is costly, and some products can be damaged by the powerful radiation. For example, some conducting materials have a resonance frequency near that of the microwave energy which can damage the product and cause fires. Solid-state devices are particularly susceptible to damage caused by electrical charge and heat generated by absorbing the radiation. Even newer microwave ovens which rapidly vary their frequencies can cause damage, in fact, they must be adjusted for each type of part being treated.

Ultraviolet-activated adhesives have also been used in the electronic device manufacturing industry. Ultraviolet-activated adhesives require the use of transparent substrates, thus, their use is limited. For example, they are typically only used to bond glass to ceramic packaging. UV-activated adhesives are also not as versatile as thermoset adhesives because, for example, the polymerization reactions typically generate low molecular weight by products that have inferior properties compared to thermoset reactions and their resulting products. Additionally, the final properties of the cured adhesive can vary widely because the polymerization reaction depends greatly on relatively minor variations in machine parameters and coating or adhesive thickness. Further, many of the radiation polymerization reactions are inhibited by oxygen and/or moisture from the atmosphere and it may be necessary to run them in inert gas atmospheres which increases production costs. One more problem is that depth of UV radiation penetration is limited to only a few thousandths of an inch. UV curing is also a highly thermal process which can damage a treated substrate and/or component (about 50% or higher of UV lamp output is waste heat).

In view of their superior properties, thermosetting coatings and adhesives are widely used and would be desirable to quickly cure them with IR energy. Although IR absorbing materials have been added to thermoset adhesive, this is not an optimal approach because the IR absorbing dyes produce anisotropic heating, specifically, most of the heating occurs only at the surface. Also, current methods of using IR energy to trigger curing fail to address the latency problem (i.e., short pot life at ambient temperatures) of thermoset adhesive because the IR energy is simply being used as a heat source to raise they temperature of the adhesive and thereby increase the polymerization reaction. Because reaction rates typically double with every 10° C. rise in temperature, thermoset materials must either be catalyzed just prior to use, or stored in a freezer and used before they polymerize, or partially polymerize to a point where the viscosity is too high for normal application.

To date, therefore, methods of curing thermoset adhesive with IR energy have not been satisfactory. As such, a need exists for a simple, cost-effective approach for curing thermoset adhesives with IR energy.

SUMMARY OF THE INVENTION

Among the objects of the present invention is an epoxy adhesive for which the curing reaction is initiated with IR energy; an epoxy adhesive that is truly latent, i.e., it is not a two-part adhesive and can be stored at ambient temperatures; and a latent epoxy adhesive that is cured without heating; and an epoxy adhesive which can be selectively cured by IR energy photolithography.

Briefly, therefore, the present invention is directed to a releasable microcapsule wall comprising a polymer and an infrared absorber.

Additionally, the present invention is directed to a microcapsule wall releasable upon exposure to infrared energy of between about 5 and about 30 watts at a wavelength that is between about 700 and about 12,000 nm. The microcapsule wall comprising a polymer which is substantially transmitting of infrared energy at the foregoing wavelength, and an infrared absorber which that is substantially absorbing of infrared energy at the foregoing wavelength.

The present invention is also directed to a microencapsulated material that is released from encapsulation by the application of infrared energy, the microencapsulated material comprising an infrared absorber, an internal component and a wall that covers substantially the entire surface of the internal component.

Additionally, the present invention is directed to an uncured adhesive comprising an resin component, a hardener component, and a microencapsulated accelerator component, wherein the microencapsulated accelerator component comprises an infrared absorber, an accelerator and a wall that covers substantially the entire surface of the accelerator.

In yet another aspect of the present invention, it is directed to a method of curing an epoxy adhesive. The method comprises exposing an uncured epoxy adhesive to infrared energy that is absorbed by an infrared absorber so that a way covering substantially an entire surface of an accelerator disintegrates thereby allowing the accelerator to facilitate a curing reaction. The uncured epoxy adhesive comprises a resin component, a hardener component, and a microencapsulated accelerator component, and the microencapsulated accelerator component comprises the wall, the infrared absorber, and the accelerator.

Additionally, the present invention is directed to a method of affixing an electronic device to a printed circuit board. The method comprises depositing an uncured adhesive onto the circuit board. The method comprises exposing the uncured epoxy adhesive to infrared energy that is absorbed by an infrared absorber so that a wall covering substantially an entire surface of an accelerator disintegrates thereby allowing the accelerator to facilitate a curing reaction. The uncured epoxy adhesive comprises a resin component, a hardener component, and a microencapsulated accelerator component, and the microencapsulated accelerator component comprises the wall, the infrared absorber, and the accelerator. The method also comprises depositing the electronic device onto the uncured epoxy adhesive.

Other objects will be in part apparent and in part pointed out hereinafter.

DETAILED DESCRIPTION OF THE INVENTION

This invention relates to the curing of adhesives using infrared and/or near-infrared energy. Specifically, the present invention is directed to, at least in part, encapsulating at least one epoxy adhesive component in a releasable microcapsule wherein the releasable microcapsule disintegrates upon being exposed to IR energy thereby releasing the encapsulated epoxy adhesive component and resulting in the curing of the epoxy adhesive.

Although the following discussion is directed to epoxy adhesives, the present invention is not limited to this application. Rather, in general terms, the present invention is useful for any application in which it is desirable to isolate a first constituent from a second constituent which the first constituent is intermixed with or contacting until such time that the mixture is exposed to IR energy.

Generally speaking, epoxy adhesives which are curable at room temperature (about 25° C.) comprise a resin component, a hardener component (also referred to as a co-reactant), an accelerator component and optionally one or more additive components. Without the accelerator component, the epoxy adhesive will not cure at room temperature if the hardener is of the anhydride class (the class of hardener that is typically used for electronic device encapsulants, underfills and laminates). The epoxy-anhydride system is preferred for electronic and other industrial applications because of such properties as high temperature stability, safety and low odor. As a result, the epoxy-anhydride system is considered by manufacturers to be superior to amine-cure two-part products.

The polymerization reaction begins, or the rate of the reaction is greatly increased, when the accelerator component is added to the mixture. Thus, the accelerator component is typically added just prior to using the epoxy adhesive (i.e., a two-part system), or the epoxy adhesive is kept frozen prior to use (i.e., a one-part system) to prevent the reaction. The present invention eliminates the need for two-part systems and freezing by isolating the accelerator from the other adhesive components within IR energy releasable microcapsules. This allows for a fully mixed polymer system which remains latent at ambient temperatures until the polymerization is initiated by a brief exposure to IR energy.

The resin component comprises at least one epoxy resin which comprises two or more epoxy groups in a single molecule. The present invention is applicable for all known types of epoxy resins. Typical examples include polyglycidyl ethers of polyhydric phenols such as bisphenol epoxy resins derived from epichlorohydrin and bisphenol A or bisphenol F, and epoxy novolak resins derived from epichlorohydrin and phenol novolak or cresol novolak. Other examples include polyglycidyl esters of polycarboxylic acids, alicyclic epoxy compounds, polyglycidyl ethers of polyhydric alcohols, and polyglycidyl compounds of polyvalent amines. These compounds may be partly modified in the structure, e.g., with urethane. Additional examples of suitable epoxy resins are found in The Epoxy Resin Handbook, Lee, Henry and Neville, Kris, McGraw-Hill, Inc., New York, N.Y.

Preferably, at least a portion of resin component comprises an epoxy resin that is a liquid at about room temperature (e.g., at about 25° C.). Preferably, the viscosity of the liquid epoxy resin and/or the epoxy adhesive as a whole ranges from about 100 to about 20,000 cps depending on the application. Applications such as protective coatings (e.g., conformal, graphic and legend inks), solder masks, and laminating adhesives typically use an epoxy adhesive having a viscosity that ranges from about 5,000 to about 25,000 cps. While applications such as liquid encapsulants, chip coatings and underfills usually use an epoxy adhesive having a viscosity that ranges from about 100 to about 5,000 cps. Also, the epoxy resin and/or the epoxy adhesive is preferably characterized by a high degree of purity to prevent corrosion of circuits and longer curing durations. For example, the epoxy resin component preferably comprises less than about 10 ppm of impurity ions such as $Na^+$, $K^+$, $SO_4^{-2}$, and $NH_4$.

The resin component may also comprise a resin that is solid at room temperature (e.g., solid epoxy-anhydride coated with a solvent). Solid resins may be added to control viscosity and improve film-forming properties such as flexibility, strength and thermal expansion. A solid resin typically comprises a functional group such as carboxyl group, hydroxyl group, vinyl group, amino group, epoxy group, and mixtures thereof. Examples of solid resins include phenoxy resin, polyvinyl acetal, polyamide, polyester, polyurethane, ethylene-vinyl acetate copolymer, acrylic esters, acrylonitrile-butadiene rubber, styrene-butadiene rubber, styrene-isoprene rubber, and styrene-ethylene-butylene copolymer which have been modified with a functional group such as mentioned above. Although generally not preferred, in certain applications the resin component may comprise 100% solid epoxy such as Bisphenol A-type epoxies used for epoxy molding compounds (EMC).

The hardener component reacts with the resin component to cure the epoxy adhesive or coating and becomes part of the polymer backbone structure. The typical types of hardeners used in epoxy adhesives include, for example, aliphatic amines, aromatic amines, anhydrides, thiols, alcohols, phenols, isocyanates, boron complexes, and inorganic acids. Preferably, the hardener component is an anhydride type such as maleic anhydride (MA), phthalic anhydride (PA) (e.g., methyltetrahydrophthalic anhydride, tetrachlorophthalic anhydride, 3 or 4-methyl-1,2,3,6-tetrahydrophthalic anhydride, 3 or 4-methylhexahydrophthalic anhydride, methyl-3,6-endomethylene-1,2,3,6-tetrahydrophthalic anhydride) succinic anhydride (SA), nadic methyl anhydride (NMA), and mixtures thereof. Anhydride hardeners are preferred for most industrial used for several reasons including: higher temperature stability, dimensional stability (low degree of shrinkage); the ability to copolymerize with other monomers such as polyols to impart flexibility, and increase control of polymerization and resulting properties. Other than the anhydrides, the foregoing hardener components may be classified as accelerator compounds because they tend to react with epoxies and tend to increase the rate of reaction between the epoxy and an anhydride. Thus, they tend to decrease the pot life of the thermoset adhesive unless treated as an accelerator component (see infra).

The concentrations of the resin component and the hardener component are such that the polymerization reaction is approximately stoichiometric. Polymerization reactions are extremely complex and depend greatly upon the accelerator component and other components, and as a result are usually determined empirically by analysis of the cured products using thermogravimetric analysis (TGA) or differential scanning calorimetry (DSC). As a result, formulations depend upon the intended use and are well established within the electronics industry.

The accelerator component initiates and/or accelerates the reaction between the resin component and the hardener component by either catalyzing and/or taking part in the reaction. Preferably, the accelerator component and the other epoxy adhesive components are selected such that the epoxy adhesive cures at room temperature. Such an accelerator component typically comprises nitrogen and may be a liquid, a solid or a mixture of solid and liquid compounds. Preferable liquid accelerators include, e.g., amine compounds, imidazole compounds and mixtures thereof. Exemplary liquid accelerator compounds include 2-methylimidazole, 2-ethyl, 4-methylimidazole, 1-benzyl-2-methyl imidizole, 1-cyanoethyl-2-phenyl-4,5-dihydroxymethyl imidazole, difunctional mercaptans (e.g., Anchor 2031), and stannous octoate. Preferable solid accelerators include, e.g., urea, 2-phenyl-4,5-dihydroxymethyl imidazole, and imidazole. Preferably, the accelerator component comprises between about 0.1 and about 2% by weight of the epoxy adhesive, and more preferably between about 0.3 and about 1% by weight.

The present invention releases the accelerator at the time of use so faster accelerators can be used. Generally, faster accelerators are desirable especially for applications such as room temperature curing and "snap curing" which involves modest heating for very fast cure times. As such, imidazole derivatives, which are considered to be slow accelerators, are less desirable than unsubstituted imidazole and other "hot" accelerators.

The epoxy adhesive may comprise an additive component which acts as a filler or it may be added to control one or more properties of the epoxy adhesive such as rheology, wetting and moisture resistance. To control the rheology of the epoxy adhesive, a particulate rheology modifier may be added to the epoxy adhesive. Preferably, the rheology modifier is a thixotropic agent having an average particle size between about 0.001 and about 10 microns, and more preferably between about 0.01 and about 5 microns. Examples of particulate rheology modifiers include barium sulfate, talc, aluminum oxide, antimony oxide, kaolin, finely divided silicon dioxide which may be colloidal or rendered hydrophobic, micronized talcum, micronized mica, kaolin, aluminum oxide, aluminum hydroxide, calcium silicate, aluminum silicate, magnesium carbonate, calcium carbonate, zirconium silicate, porcelain powder, glass powder, antimony trioxide, titanium dioxide, barium titanate, barium sulfate and mixtures thereof. One particularly preferred rheology modifier is fumed silica available from Degussa Corp. of Parsippany, N.J. If present, the concentration of rheology modifier additives is preferably less than about 1% by weight of the epoxy adhesive.

To improve the ability of the epoxy adhesive to wet a surface a wetting agent may be added. Exemplary wetting agents include surfactants such as epoxy silanes, fluorosurfactants and hydrocarbon-type surfactants. A preferable surfactant is FC4430 (formally referred to as FC-430) which is available from 3M Corp. of St. Paul Minn. If present, the concentration of wetting agent comprises less than about 0.3% by weight of the epoxy adhesive.

Moisture resistance may be improved by including a coupling agent in the epoxy adhesive. Typical coupling agents include organic metal compounds that comprise chromium, silane, titanium, aluminum and zirconium. The most commonly used coupling agents comprise silane such as vinyl-triethoxysilane, vinyltris(β-methoxyethoxy)silane, γ-methacryloxypropyltrimethoxysilane, γ-glycidoxypropyltrimethoxysilane, β-(3,4-epoxycyclohexyl)ethyltrimethoxysilane, N-β(aminoethyl)-γ-aminopropylmethyldimethoxy-silane, γ-aminopropyltriethoxysilane, and γ-chloropropyltrimethoxy-silane. If present, the coupling agent preferably comprises less than about 1% by weight of the epoxy adhesive.

In accordance with an embodiment of the present invention, the accelerator component, although intermixed with one or more components of the epoxy adhesive, is prevented from initiating, catalyzing and/or accelerating the curing process until desired. This is accomplished by microencapsulating the accelerator within a wall that does not release the accelerator until the microencapsulated accelerator component is exposed to IR energy. Thus, a truly latent epoxy adhesive system (i.e., mixing two parts or freezing is not required) that is curable at room temperature is available (a minor temperature increase may occur as the epoxy adhesive polymerizes and from the microcapsule wall absorbing the IR energy). Such an epoxy adhesive is easy to use, cures quickly and has improved workability.

Microencapsulation methods are well known and any appropriate method may be used to encapsulate the accelerator. Common methods include insitu polymerization, vapor phase deposition, the Wurster coating process, interfacial polymerization and pan coating. Preferably, the microcapsules have an average size that is less than about 10 μm, and more preferably the size is less than about 5 μm. The smaller the average particle size, the more uniform the curing reaction. The ease of microencapsulation is an important consideration when selecting an accelerator. While liquids can be encapsulated, solid powders are generally easier to encapsulate with many of the typical encapsulation methods.

The microcapsule wall comprises a polymeric material such as polyurethane, polystyrene, gelatin, polyisocyanate, low melting temperature polymers such as low molecular weight polyethylene, waxes and mixtures thereof and substantially coats or encapsulates the accelerator component.

The foregoing polymeric materials substantially transmit IR energy and are substantially IR energy non-absorbing. In particular, while they are necessarily absolutely transmitting and absolutely non-absorbing, their transmittance and non-absorbance are so great that they do not significantly deteriorate upon exposure to IR energy. Therefore, to render the wall disintegrable, an IR absorber is added to the microcapsule wall and/or the encapsulated material. In a preferred embodiment, the microcapsule wall comprises an IR absorber and the encapsulated material is substantially free of an IR absorber. A portion of the IR energy contacting the epoxy adhesive is absorbed by the microcapsule wall and the temperature of the microcapsule wall increases and ultimately disintegrates the wall. It is presently believed that the disintegration of the microcapsule wall is due to the wall melting and/or an increase in the pressure within the capsule. The pressure increase within the microcapsule is believed to be the result of thermal energy from the wall being conducted to the encapsulated material which increases the temperature of the encapsulated material resulting in thermal expansion.

Suitable IR absorbers include carbon black and IR absorbing dyes. Carbon black absorbs IR energy over a wide range of wavelengths (e.g., from about 800 nm to about 12 $\mu$m) and is believed to be readily incorporated into a polymeric wall using the Wurster process (a process which spray coats the capsule wall onto the material being encapsulated). Generally, too little carbon black (e.g., less than about 0.1% by weight) will not produce sufficient heating, while too much (e.g., more than about 10% by weight) is believed to weaken the polymer capsule wall. Thus, the concentration of carbon black within the wall is preferably between about 0.1 and about 10% by weight. More preferably, the concentration of carbon black preferably ranges from about 1 to about 2% by weight of the polymeric wall.

In certain applications carbon black is not a preferred IR absorber. Specifically, carbon black is electrically conductive and is typically undesirable in dielectric applications. Additionally, carbon black is readily visible and the appearance of an epoxy adhesive containing carbon black may be unacceptable. As such, in a preferred embodiment the microcapsule wall comprises one or more IR absorbing dyes which are typically transparent in the visible spectrum and not electrically conductive. Such dyes have a maximum absorbance that is between about 800 nm and about 1000 nm. The dye or dyes selected for incorporation within the microcapsule wall will preferably have a maximum absorbance wavelength that is within about 50 nm of the IR energy being used to cure the epoxy adhesive. For example, the Speedline/Electrovert DLS laser emits at about 808 nm so a preferable dye will have a maximum absorbance that is between about 800 and about 850 nm. Dyes, which have a maximum absorbance that is between about 700 nm and about 1600 nm, are available from dye manufacturers such as Epolin, Inc. of Newark, N.J. The concentration of dye in the wall is preferably between about 1 and about 10% by weight. More preferably, the concentration of IR absorbing dyes is between about 1 and about 2% by weight.

The thin capsule wall will heat up and rupture, melt, decompose or otherwise open in a fraction of a second upon being exposed with between about 5 and about 30 watts of IR energy at a wavelength(s) between about 700 and about 12,000 nm. The foregoing IR energy may be economically and practically applied in conventional manufacturing applications to accelerate and cure adhesive under mass production parameters. For example, the IR energy may be directed at the epoxy adhesive in any appropriate pattern such as in the form of a dot or as a line of radiation. A small dot laser requires several seconds to cover a square inch whereas a line of laser energy could cover the same are in a substantially shorter period of time. A line-type laser pattern may be produced by using numerous diodes positioned in a line. For example, the Speedline Technologies/Electrovert DLS laser comprises a bar of 19 diodes which produce a line of radiation that is converted to a laser dot using optical fiber and optics. Rather than converting the energy to a laser dot, diode bars can be placed end-to-end to form a laser line of the desired length. Advantageously, this results in the line-type laser becoming an infrared equivalent to ultraviolet curing. Additionally, a line-type configuration results in a simpler and less costly IR energy-emitting device that cures relatively large areas of epoxy adhesive more quickly than dot-type laser devices. For example, several bars could be used together to produce a line of infrared or near infrared that was 12" long thus allowing a 12" wide web of coated material to be processed at several inches per second.

Although unnecessary for curing the above-described epoxy adhesive, there may be applications in which it is desirable to heat the epoxy adhesive with IR energy (e.g., to increase the rate at which the epoxy is cured). In such an embodiment, an IR absorber may be intermixed with the portion of the epoxy adhesive that is not encapsulated. If present in the non-encapsulated portion of the epoxy adhesive, the total concentration of IR absorber in the epoxy adhesive is preferably between about 0.1 and about 2% by weight, and more preferably between about 0.3 and about 1% by weight.

In an embodiment of the present invention, a laser curable epoxy adhesive is used in photolithographic processes. Specifically, a coating of the epoxy adhesive is selectively exposed to IR energy and only the exposed microcapsules rupture which causes localized curing of the epoxy. Uncured resin is washed away or dissolved in solvent to leave a pattern of cured epoxy. If three-dimensional shapes (stereo lithography) are desired, the Z-axis focal point of the laser beam is adjusted.

In another embodiment of the present invention, the epoxy adhesive is made electrically and thermally conductive by adding metal fillers, such as silver. The conductive epoxy adhesive is printed, or otherwise deposited on a circuit board, activated by the IR radiation and then components placed onto the adhesive. Surface mount technology allows components to be placed accurately and quickly so that the irradiated adhesive is still in a paste-like state. This allows component assembly to take place at lower temperatures so that temperature sensitive components or circuit materials can be used.

In yet another embodiment of the present invention, the epoxy adhesive is made thermally conductive and electrically insulative, by adding a mineral filler such as aluminum nitride (AlN). Such a thermally conductive adhesive is, e.g., be applied to a leadframe, or chip carrier, activated with IR radiation, and then an IC (die) placed thereon. This allows die bonding of temperature sensitive chips such as optoelectronics and microelectromechanical systems (MEMS).

In another embodiment of the present invention, the epoxy adhesive is selectively cured by exposure to a laser having controlled and programmable movement such as the Speedline Technologies/Electrovert DLS machine. The material can be applied over the entire substrate or printed selectively. Methods for coating the entire substrate include printing, roller coating, spraying, dip coating, curtain coating and other such methods well know in the art of coating and printing. The "wet", or unhardened, coating is exposed to a laser beam that is positioned by an X-Y gantry, as in the case of the DLS unit, or by gimbaled mirrors. Material exposed to the beam hardens after the ruptured capsules release the accelerator. An alternative method of applying energy is by use of conventional infrared sources such as ceramic heating rods positioned so that the energy is directed through a photomask onto the coating. Uncured material will remain soluble in polar solvents such as ketones and can therefore be removed and recovered. After removal, or development, the remaining patterned coating can be further hardened by heat exposure if necessary.

In yet another embodiment of selective hardening/curing, a circuit board is coated with a conductive adhesive/ink known as a polymer thick film (PTF), the conductive adhesive/ink is selectively exposed and activated causing curing of a circuit pattern and the uncured material is removed with a solvent. This allows electrical circuits to be directly formed instead of by etching. PTF is a low cost commercially-successful circuit creation method that is limited by feature size, and thus, density, and as a result this embodiment of the present invention enhances the usefulness and applicability of PTF technology.

Another variation of selective hardening/curing is used to provide patterns of high resolution despite the fact that the epoxy adhesive is applied by a relatively low resolution method. For example, a coating may be screen printed at a resolution of about 8 to 10 mils (about 200–250 $\mu$m) and then exposed to a narrow beam of laser radiation for hardening. The narrow beam of laser radiation having a width of, e.g., about 2 mils (about 50 $\mu$m) or less, would result in a final line width of the about the same width. The excess uncured material (non-irradiated material) is then removed with a solvent. Thus, the resolution of a selective deposition method such as screen printing can be improved by orders of magnitude In still another embodiment of the present invention, the infrared energy is used to initiate the epoxy curing reaction prior to other process operations such as lamination rather than curing a previously assembled device. For example, a thermosetting composition of this invention is applied to a printed circuit dielectric substrate and then exposed to a infrared radiation. The accelerator is selected to provide a desired induction, or period of delay, to allow a second layer of material, such as a copper foil, to be applied and bonded to the printed circuit dielectric substrate to form a circuit laminate. The circuit laminate is allowed to continue curing at the ambient temperature or at some elevated temperature necessary to provide the desired properties. This process is particularly efficient and cost-effective because the laminate can be placed in storage while curing, or "aging," thereby freeing manufacturing equipment.

In view of the above, it will be seen that the several objects of the invention are achieved. As various changes could be made in the above-described invention without departing from the scope of the invention, it is intended that all matter contained in the above description be interpreted as illustrative and not in a limiting sense.

What is claimed is:

1. An uncured adhesive comprising a resin component, a hardener component, and a microencapsulated accelerator component, wherein the microencapsulated accelerator component comprises an infrared absorber, an accelerator and a wall that covers substantially the entire surface of the accelerator, wherein the wall isolates the accelerator from the resin component and the hardener component.

2. An uncured adhesive comprising a resin component, a hardener component, and a microencapsulated accelerator component, wherein the microencapsulated accelerator component comprises an infrared absorber, an accelerator and a wall that covers substantially the entire surface of the accelerator, wherein the wall comprises a polymer selected from the group consisting of polyurethane, polystyrene, polyisocyanate, gelatin, a low melting temperature polymer, a wax and mixtures thereof.

3. An uncured adhesive comprising a resin component, a hardener component, and a microencapsulated accelerator component, wherein the microencapsulated accelerator component comprises an infrared absorber, an accelerator and a wall that covers substantially the entire surface of the accelerator, wherein the wall comprises the infrared absorber.

4. The uncured adhesive as set forth in claim 1 wherein the infrared absorber is encapsulated by the wall.

5. An uncured adhesive comprising a resin component, a hardener component, and a microencapsulated accelerator component, wherein the microencapsulated accelerator component comprises an infrared absorber, an accelerator and a wall that covers substantially the entire surface of the accelerator, wherein the infrared absorber is selected from the group consisting of carbon black, an infrared absorbing dye and mixtures thereof.

6. The uncured adhesive as set forth in claim 5 comprising between about 0.1 and about 10 percent by weight of carbon black.

7. The uncured adhesive as set forth in claim 5 comprising between about 1 and about 2 percent by weight of carbon black.

8. The uncured adhesive as set forth in claim 5 comprising between about 1 and about 10 percent by weight of an infrared absorbing dye.

9. The uncured adhesive as set forth in claim 5 comprising between about 1 and about 2 percent by weight of an infrared absorbing dye.

10. The uncured adhesive as set forth in claim 1 wherein the resin component comprises a liquid epoxy resin selected from the group consisting of polyglycidyl ethers of polyhydric phenols, polyglycidyl esters of polycarboxylic acids, alicyclic epoxy compounds, polyglycidyl ethers of polyhydric alcohols, polyglycidyl compounds of polyvalent amines and mixtures thereof.

11. The uncured adhesive as set forth in claim 10 wherein the liquid epoxy resin is a bisphenol epoxy resin.

12. The uncured adhesive as set forth in claim 11 wherein the liquid epoxy resin is a bisphenol A epoxy resin.

13. The uncured adhesive as set forth in claim 1 wherein the resin component comprises a solid resin that comprises a base compound and a functional group, wherein the base compound is selected from the group consisting of phenoxy resin, polyvinyl acetal, polyamide, polyester, polyurethane, ethylene-vinyl acetate copolymer, acrylic esters, acrylonitrile-butadiene rubber, styrene-butadiene rubber, styrene-isoprene rubber, styrene-ethylene-butylene copolymer and mixtures thereof, and the functional group is selected from the group consisting of a carboxyl group, a hydroxyl group, a vinyl group, an amino group, an epoxy group and mixtures thereof.

14. The uncured adhesive as set forth in claim 1 wherein the hardener component is selected from the group consisting of an aliphatic amine, an aromatic amine, an anhydride, a thiol, an alcohol, a phenol, an isocyanates, a boron complex, an inorganic acid and mixtures thereof.

15. The uncured adhesive as set forth in claim 14 wherein the hardener component is an anhydride selected from the group consisting of a maleic anhydride, a phthalic anhydride, a succinic anhydride, a nadic methyl anhydride and mixtures thereof.

16. The uncured adhesive as set forth in claim 1 wherein the accelerator comprises nitrogen.

17. The uncured adhesive as set forth in claim 16 wherein the accelerator comprises an amine group.

18. The uncured adhesive as set forth in claim 16 wherein the accelerator comprises an imidazole group.

19. An uncured adhesive comprising a resin component, a hardener component, and a microencapsulated accelerator component, wherein the microencapsulated accelerator component comprises an infrared absorber, an accelerator and a wall that covers substantially the entire surface of the accelerator, wherein the accelerator comprises nitrogen and is selected from the group consisting of imidazole, 2-methylimidazole, 2-ethylimidazole, 4-methylimidazole, 1-benzyl-2-methyl imidizole, 1-cyanoethyl-2-phenyl-4, 5-dihydroxymethyl imidazole, 2-phenyl-4, 5-dihydroxymethyl imidazole, a difunctional mercaptan, stannous octoate, urea and mixtures thereof.

20. The uncured adhesive as set forth in claim 16 wherein the accelerator comprises between about 0.1 and about 2 percent by weight of the uncured adhesive.

21. The uncured adhesive as set forth in claim 6 wherein the accelerator comprises between about 0.3 and about 1 percent by weight of the uncured adhesive.

22. A method of curing an adhesive, the method comprising:
 exposing an uncured adhesive to infrared energy that is absorbed by an infrared absorber so that a wall covering substantially an entire surface of an accelerator disintegrates thereby allowing the accelerator to facilitate a curing reaction;
 wherein the uncured adhesive comprises a resin component, a hardener component, and a microencapsulated accelerator component; and
 wherein the microencapsulated accelerator component comprises the wall, the infrared absorber, and the accelerator.

23. The method as set forth in claim 22 wherein the wall comprises a polymer selected from the group consisting of polyurethane, polystyrene, polyisocyanate, gelatin, a low melting temperature polymer, a wax and mixtures thereof.

24. The method as set forth in claim 22 wherein the infrared absorber is substantially uniformly constituted throughout the wall.

25. The method as set forth in claim 22 wherein the infrared absorber is encapsulated by the wall.

26. The method as set forth in claim 22 wherein the infrared absorber is selected from the group consisting of carbon black, an infrared absorbing dye and mixtures thereof.

27. The method as set forth in claim 26 wherein the microencapsulated accelerator component comprises between about 0.1 and about 10 percent by weight of carbon black.

28. The method as set forth in claim 26 wherein the microencapsulated accelerator component comprises between about 1 and about 2 percent by weight of carbon black.

29. The method as set forth in claim 26 wherein the microencapsulated accelerator component comprises between about 1 and about 10 percent by weight of an infrared absorbing dye.

30. The method as set forth in claim 26 wherein the microencapsulated accelerator component comprises between about 1 and about 2 percent by weight of an infrared absorbing dye.

31. The method as set forth in claim 22 wherein the resin component comprises a liquid epoxy resin selected from the group consisting of polyglycidyl ethers of polyhydric phenols, polyglycidyl esters of polycarboxylic acids, alicyclic epoxy compounds, polyglycidyl ethers of polyhydric alcohols, polyglycidyl compounds of polyvalent amines and mixtures thereof.

32. The method as set forth in claim 31 wherein the liquid epoxy resin is a bisphenol epoxy resin.

33. The method as set forth in claim 32 wherein the liquid epoxy resin is a bisphenol A epoxy resin.

34. The method as set forth in claim 22 wherein the resin component comprises a solid resin that comprises a base compound and a functional group, wherein the base compound is selected from the group consisting of phenoxy resin, polyvinyl acetal, polyamide, polyester, polyurethane, ethylene-vinyl acetate copolymer, acrylic esters, acrylonitrile-butadiene rubber, styrene-butadiene rubber, styrene-isoprene rubber, styrene-ethylene-butylene copolymer and mixtures thereof, and the functional group is selected from the group consisting of a carboxyl group, a hydroxyl group, a vinyl group, an amino group, an epoxy group and mixtures thereof.

35. The method as set forth in claim 22 wherein the hardener component is selected from the group consisting of an aliphatic amine, an aromatic amine, an anhydride, a thiol, an alcohol, a phenol, an isocyanates, a boron complex, an inorganic acids and mixtures thereof.

36. The method as set forth in claim 35 wherein the hardener component is an anhydride selected from the group consisting of a maleic anhydride, a phthalic anhydride, a succinic anhydride, a nadic methyl anhydride and mixtures thereof.

37. The method as set forth in claim 22 wherein the accelerator comprises nitrogen.

38. The method as set forth in claim 37 wherein the accelerator comprises an amine group.

39. The method as set forth in claim 37 wherein the accelerator comprises an imidazole group.

40. The method as set forth in claim 37 wherein the accelerator is selected from the group consisting of imidazole, 2-methylimidazole, 2-ethyl, 4-methylimidazole, 1-benzyl-2-methyl imidizole, 1-cyanoethyl-2-phenyl-4, 5-dihydroxymethyl imidazole, 2-phenyl-4,5-dihydroxymethyl imidazole, a difunctional mercaptan, stannous octoate, urea and mixtures thereof.

41. The method as set forth in claim 37 wherein the accelerator comprises between about 0.1 and about 2 percent by weight of the uncured adhesive.

42. The method as set forth in claim 37 wherein the accelerator comprises between about 0.3 and about 1 percent by weight of the uncured adhesive.

* * * * *